United States Patent
Lee et al.

(10) Patent No.: US 11,825,695 B2
(45) Date of Patent: Nov. 21, 2023

(54) PIXEL WITH IMPROVED APERTURE RATIO AND DISPLAY DEVICE INCLUDING THE SAME

(71) Applicant: LG Display Co., Ltd., Seoul (KR)

(72) Inventors: Soyoung Lee, Paju-si (KR); Hun Jang, Paju-si (KR); Daeyoung Seo, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 179 days.

(21) Appl. No.: 17/390,227

(22) Filed: Jul. 30, 2021

(65) Prior Publication Data

US 2022/0037439 A1 Feb. 3, 2022

(30) Foreign Application Priority Data

Jul. 31, 2020 (KR) .................. 10-2020-0096366

(51) Int. Cl.
  *H01L 29/08* (2006.01)
  *H10K 59/121* (2023.01)
  *H10K 59/131* (2023.01)

(52) U.S. Cl.
  CPC ..... *H10K 59/1213* (2023.02); *H10K 59/1216* (2023.02); *H10K 59/131* (2023.02)

(58) Field of Classification Search
  CPC ............ H10K 59/1213; H10K 59/131; H10K 59/1216
  USPC ......................................................... 257/40
  See application file for complete search history.

(56) References Cited

U.S. PATENT DOCUMENTS

| | | | |
|---|---|---|---|
| 9,093,023 B1* | 7/2015 | Kim | ................. H10K 59/88 |
| 10,192,935 B2 | 1/2019 | Shim et al. | |
| 10,424,630 B2 | 9/2019 | Han et al. | |
| 2011/0260168 A1* | 10/2011 | Toyota | ............. H01L 29/78621 257/59 |
| 2019/0207140 A1* | 7/2019 | Lee | ..................... H01L 27/1248 |
| 2020/0302840 A1* | 9/2020 | Kim | ....................... G09G 3/006 |

FOREIGN PATENT DOCUMENTS

| | | |
|---|---|---|
| KR | 10-2015-0076485 A | 7/2015 |
| KR | 10-2018-0014339 A | 2/2018 |
| KR | 10-2018-0025520 A | 3/2018 |
| KR | 10-2016-0083532 A | 7/2018 |
| KR | 10-2019-0002884 A | 1/2019 |
| KR | 10-2019-0013132 A | 2/2019 |
| KR | 10-2019-0070768 A | 6/2019 |
| KR | 10-2019-0076637 A | 7/2019 |

* cited by examiner

*Primary Examiner* — Phuc T Dang
(74) *Attorney, Agent, or Firm* — Birch, Stewart, Kolasch & Birch, LLP

(57) ABSTRACT

A pixel is discussed, which is disposed in a pixel area defined by a gate line, a data line and a pixel power line, and includes a light emission portion and a pixel circuit, wherein the pixel circuit can include a protrusion electrode protruded from the gate line along a length direction of the data line, and first and second thin film transistors disposed in parallel between the light emission portion and the gate line, using the protrusion electrode as a gate electrode.

19 Claims, 16 Drawing Sheets

PXL

PIXEL WITH IMPROVED APERTURE RATIO AND DISPLAY DEVICE INCLUDING THE SAME

CROSS-REFERENCE TO RELATED APPLICATIONS

This application claims the priority benefit of the Korean Patent Application No. 10-2020-0096366 filed on Jul. 31, 2020 in the Republic of Korea, the entire contents of which are hereby expressly incorporated by reference as if fully set forth herein into the present application.

BACKGROUND

Field of the Invention

The present disclosure relates to a pixel and a display device including the same.

Discussion of the Related Art

With the advancement of the information age, the demand for a display device for displaying an image has increased with various forms. Therefore, various types of display devices such as a liquid crystal display (LCD) device, a plasma display panel (PDP) device, and an organic light emitting display (OLED) device have been recently used.

Among such display devices, the organic light emitting display device is a self-luminance display device using an organic light emitting diode which injects holes from an anode and electrons from a cathode into a light emitting layer and emits light when an exciton generated by combination of the injected holes and electrons changes its state from an excited state to a ground state.

The organic light emitting display device can be categorized into a top emission type, a bottom emission type, and a dual emission type depending on an emitted direction of light, and can be categorized into a passive matrix type and an active matrix type depending on a driving method.

The organic light emitting display device does not need a separate light source unlike a liquid crystal display (LCD) device and thus can be manufactured into a lightweight and thin form. Further, the organic light emitting display device is advantageous in view of power consumption since it is driven with a low voltage. Also, the organic light emitting display device has excellent color expression ability, a high response speed, a wide viewing angle, and a high contrast ratio (CR). Therefore, the organic light emitting display device has been researched as the next-generation display device.

The organic light emitting display device has been developed in a structure of large area and/or ultra-high resolution, whereby a size of a pixel has been reduced. In this respect, a high aperture ratio structure for enhancing a ratio of an opening area in a pixel has been required. As opening areas are increased, the probability of occurrence of a pixel defect is increased in ultra-high resolution. When a defect occurs in a pixel, the pixel is connected with another pixel, which has the same color as that of the above pixel and is adjacent thereto, whereby the pixel having a defect may not be recognized by a user. Considering these various circumstances, the development of a display device, which can make sure of a high aperture ratio in a large area and/or ultra-high resolution and has a repair structure for a pixel having a defect, will be needed.

The disclosure of the above-described background art is owned by the inventor(s) of the present disclosure to devise the present disclosure or is technical information acquired by a process of devising the present disclosure, but cannot be regarded as the known art disclosed to the general public before the present disclosure is disclosed.

SUMMARY OF THE DISCLOSURE

The present disclosure has been made in view of the above issues and other limitations associated with the related art, and it is an object of the present disclosure to provide a pixel and a display device including the same, in which an aperture ratio can be improved within a limited space of a subpixel, a structure can be simplified, and an improved repair structure can be obtained.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a pixel disposed in a pixel area defined by a gate line, a data line and a pixel power line, and comprising a light emission portion and a pixel circuit, wherein the pixel circuit can include a protrusion electrode protruded from the gate line along a length direction of the data line, and first and second switching thin film transistors disposed in parallel between the light emission portion and the gate line, using the protrusion electrode as a gate electrode.

In accordance with another aspect of the present disclosure, the above and other objects can be accomplished by the provision of a display device including the above pixel.

In accordance with another aspect of the present disclosure, the above and other objects can be accomplished by the provision of a display device including a plurality of subpixels disposed in a pixel area defined by a gate line, a data line and a pixel power line, having a light emission portion and a pixel circuit, wherein the pixel circuit can include a driving thin film transistor connected to a first node, a second node and the pixel power line, a first switching thin film transistor connected to the gate line, the data line and the first node between the light emission portion and the gate line, a second switching thin film transistor disposed to be parallel with the first switching thin film transistor between the light emission portion and the gate line and connected to a reference lines and the second node, a capacitor between the first node and the second node, and a protrusion electrode protruded from the gate line to overlap each of the first and second switching thin film transistors, and the protrusion electrode can be a gate electrode of each of the first and second switching thin film transistors.

In the display device according to the present disclosure, the sensing thin film transistor and the switching thin film transistor can be disposed at the lower portion based on the opening area of each subpixel, the sensing and switching thin film transistors share the gate electrode, and the data line and the sensing line can simultaneously be subjected to repair cutting, whereby an aperture ratio can be improved within a limited space of the subpixel, and an improved repair structure can be embodied. As a result, display performance can be improved by luminance increase based on improvement of the aperture ratio, and lifespan of the light emitting diode can be improved.

In addition to the effects of the present disclosure as mentioned above, additional objects and features of the present disclosure will be clearly understood by those skilled in the art from the following description of the present disclosure.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1:
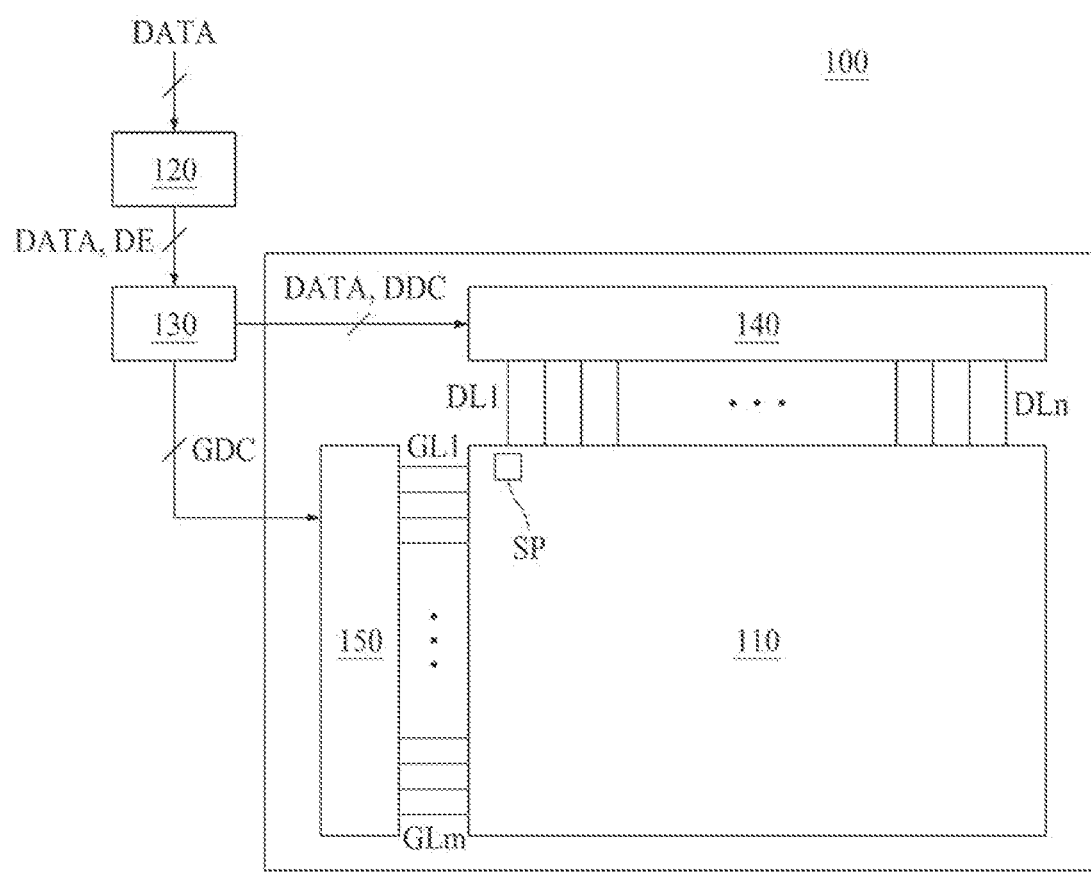
FIG. 1 is a schematic block view illustrating a display device according to various embodiments of the present disclosure.

Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description may be omitted or may be described briefly.

In a case where 'comprise', 'have', and 'include' described in the present specification are used, another part can be added unless 'only~' is used. The terms of a singular form can include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions can be arranged between two other portions unless 'just' or 'direct' is used.

In describing a temporal relationship, for example, when the temporal order is described as "after," "subsequent," "next," and "before," a case which is not continuous can be included, unless "just" or "direct" is used.

It will be understood that, although the terms "first", "second", etc. can be used herein to describe various elements, these elements should not be limited by these terms. These terms are only used to partition one element from another. For example, a first element could be termed a second element, and, similarly, a second element could be termed a first element, without departing from the scope of the present invention.

The terms "first horizontal axis direction," "second horizontal axis direction," and "vertical axis direction" should not be interpreted only based on a geometrical relationship in which the respective directions are perpendicular to each other, and can be meant as directions having wider directivities within the range within which the components of the present disclosure can operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Hereinafter, a preferred embodiment of a display device according to the present disclosure will be described in detail with reference to the accompanying drawings. Wherever possible, the same reference numbers will be used throughout the drawings to refer to the same or like parts. Since a scale of each of elements shown in the accompanying drawings is different from an actual scale for convenience of description, the present disclosure is not limited to the shown scale.

Figure 2:
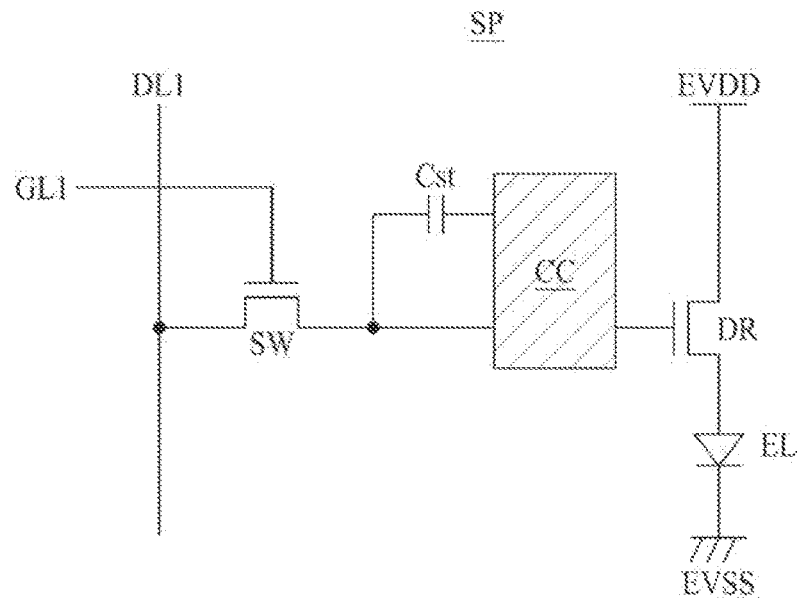
FIG. 2 is a schematic circuit driving view illustrating a subpixel of the display device of FIG. 1.
Figure 3:
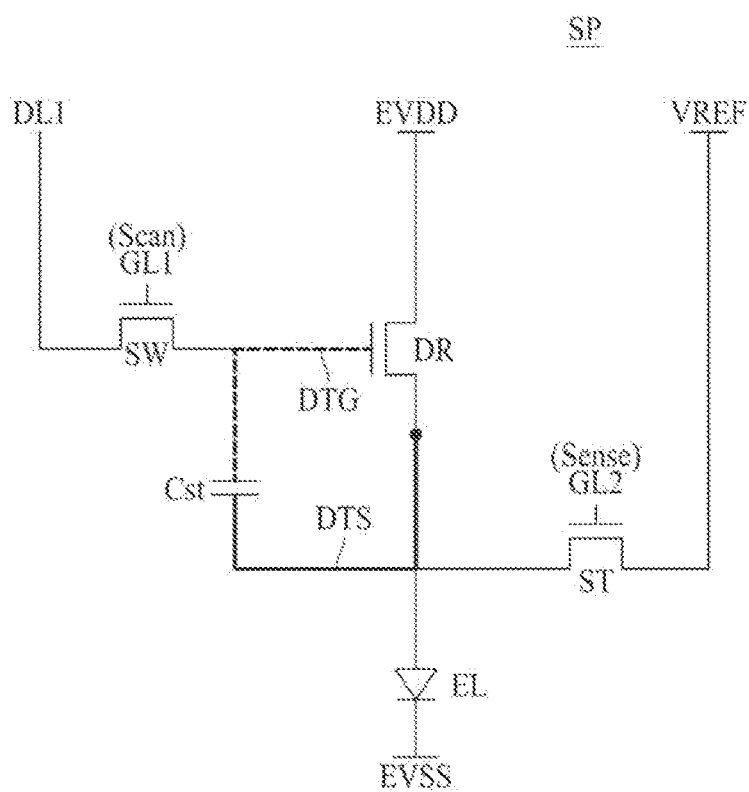
FIG. 3 is an equivalent circuit view illustrating an example of a subpixel of the display device shown in FIG. 1.

FIG. 1 is a schematic block view illustrating a display device according to various embodiments of the present disclosure. FIG. 2 is a schematic circuit driving view illustrating a subpixel of the display device of FIG. 1. FIG. 3 is an equivalent circuit view illustrating an example of a subpixel of the display device shown in FIG. 1. All the components of each display device according to all embodiments of the present disclosure are operatively coupled and configured.

Referring to FIGS. 1 to 3, a display device 100 according to various embodiments of the present disclosure can include a display panel 110, an image processor 120, a timing controller 130, a data driver 140, and a scan driver 150.

The display panel 110 can display an image in response to a data signal DATA and a scan signal, which are respectively supplied from the data driver 140 and the scan driver 150. The display panel 100 can include subpixels SP that operate to display an image.

The subpixel can be formed in a top-emission type, a bottom-emission type, or a dual-emission type in accordance with a structure. The subpixels SP can include a red subpixel, a green subpixel, and a blue subpixel, or can include a red subpixel, a blue subpixel, a white subpixel and a green subpixel. The subpixels SP can have one or more different light emission areas in accordance with light emission characteristics.

The image processor 120 can output a data enable signal DE together with the data signal DATA supplied from the outside. The image processor 120 can output one or more of a vertical synchronization signal, a horizontal synchronization signal and a clock signal in addition to the data enable signal DE, but these signals will be omitted without being shown for convenience of description.

The timing controller 130 can be supplied with the data signal DATA together with a driving signal, which includes the data enable signal DE or the vertical synchronization signal, the horizontal synchronization signal and the clock signal, from the image processor 120. The timing controller 130 can output a data timing control signal DDC for controlling an operation timing of the data driver 140 and a gate timing control signal GDC for controlling an operation timing of the scan driver 150 on the basis of the driving signal.

The data driver 140 can sample and latch the data signal DATA supplied from the timing controller 130 in response to the data timing control signal DDC supplied from the timing controller 130, convert the latched data signal into a gamma reference voltage and output the converted gamma reference voltage. The data driver 140 can output the data signal DATA through data lines DL1 to DLn, where n is a positive number such as an integer greater than 1. The data driver 140 can be embodied in the form of an Integrated Circuit (IC).

The scan driver 150 can output the scan signal in response to the gate timing control signal GDC supplied from the timing controller 130. The scan driver 150 can output the scan signal through gate lines GL1 to GLm where m is a positive number such as an integer greater than 1. The scan driver 150 can be embodied in the form of IC (Integrated Circuit), or can be embodied in the display panel 110 in a Gate In Panel (GIP) type.

As shown in FIG. 2, one subpixel SP constituting a unit pixel can include a switching thin film transistor SW, a driving thin film transistor DR, a storage capacitor Cst, a compensation circuit CC, and a light emitting diode EL.

The switching thin film transistor SW can perform a switching operation to store a data signal supplied through the first data line DL1 in the storage capacitor Cst as a data voltage in response to the scan signal supplied through the first gate line GL1. The driving thin film transistor DR can operate to flow a driving current between a first power line EVDD (e.g., high potential voltage) and a second power line EVSS (e.g., low potential voltage) in accordance with the data voltage stored in the storage capacitor Cst. The light emitting diode EL can operate to emit light in accordance with the driving current formed by the driving thin film transistor DR.

The compensation circuit CC is a circuit added within the subpixel to compensate for a threshold voltage of the driving thin film transistor DR. The compensation circuit CC can include one or more thin film transistors. The compensation circuit CC can have various configurations in accordance with a compensation method and thus its example will be described as follows.

As shown in FIG. 3, the compensation circuit CC can include a sensing thin film transistor ST and a sensing line VREF.

The sensing thin film transistor ST can be connected between a drain electrode of the driving thin film transistor DR and an anode electrode of the light emitting diode EL (hereinafter, sensing node). The sensing thin film transistor ST can operate to supply an initialization voltage (or sensing voltage) transferred through the sensing line VREF to the sensing node of the driving thin film transistor DR or sense the sensing node of the driving thin film transistor DR or a voltage or current of the sensing line VREF.

A first electrode (e.g., source electrode) of the switching thin film transistor SW can be connected to the first data line DL1, and a second electrode (e.g., drain electrode) of the switching thin film transistor SW can be connected to a gate electrode of the driving thin film transistor DR.

A first electrode (e.g., source electrode) of the driving thin film transistor DR can be connected to the first power line EVDD, and a second electrode (e.g., drain electrode) of the driving thin film transistor DR can be connected to an anode electrode of the light emitting diode EL.

The storage capacitor Cst can include a first electrode connected to the gate electrode of the driving thin film transistor DR, and a second electrode connected to the anode electrode of the light emitting diode EL. In the display device according to various embodiments of the present disclosure, the storage capacitor Cst can include a first electrode pattern DTG connected to the gate electrode of the driving thin film transistor DR and a second electrode pattern DTS connected to the source electrode of the driving thin film transistor DR. The first and second electrode patterns DTG and DTS can be formed by conductorizing an active layer. Further, the storage capacitor Cst can include a first capacitor formed in a horizontal direction and a second capacitor formed in a vertical direction in accordance with various modifications of the first electrode pattern DTG and the second electrode pattern DTS. For example, each of the first and second electrode patterns DTG and DTS can include a finger pattern structure in which the first and second electrode patterns are disposed in parallel on the same plane. A horizontal capacitor can be formed by the structures spaced apart from each other in the horizontal direction. The storage capacitor Cst will be described later in more detail.

The anode electrode of the light emitting diode EL can be connected to the second electrode of the driving thin film transistor DR, and its cathode electrode can be connected to the second power line EVSS. For example, the light emitting diode EL can be an Organic Light Emitting Diode (OLED).

A first electrode (e.g., source electrode) of the sensing thin film transistor ST can be connected to the sensing line VREF, and its second electrode (e.g., drain electrode) can be connected to the anode electrode of the light emitting diode EL and the second electrode of the driving thin film transistor DR, which are sensing nodes.

The operation time of the sensing thin film transistor ST can be similar to, the same as, or different from that of the switching thin film transistor SW in accordance with a compensation algorithm (or configuration of the compensation circuit). For example, the gate electrode of the switching thin film transistor SW can be connected to the first gate line GL1, and the gate electrode of the sensing thin film transistor ST can be connected to the second gate line GL2. In this case, the scan signal Scan can be transferred to the first gate line GL1, and a sensing signal Sense can be transferred to the second gate line GL2. For another example, the first gate line GL1 connected to the gate electrode of the switching thin film transistor SW and the second gate line GL2 connected to the gate electrode of the sensing thin film transistor ST can be connected to each other.

The sensing line VREF can be connected to the data driver 140. In this case, the data driver 140 can sense the sensing node of the subpixel for a real time, e.g., in a non-display period of an image or a non-display period in N frame period (N is an integer of 1 or more), and can generate the sensed result. Meanwhile, the switching thin film transistor SW and the sensing thin film transistor ST can be turned on at the same time. In this case, a sensing operation through the sensing line VREF and a data output operation for outputting a data signal can be separated (identified) from each other by a time division method of the data driver 140.

In addition, a compensation target based on the sensed result can be a digital type data signal, an analog type data signal, or gamma. A compensation circuit for generating a compensation signal (or compensation voltage) based on the sensed result can be embodied as an internal circuit of the data driver 140, an internal circuit of the timing controller 130 or a separate circuit.

Also, in the example of FIG. 3, although the subpixel of a 3T (Transistor) 1C (Capacitor) structure that includes the switching thin film transistor SW, the driving thin film transistor DR, the storage capacitor Cst, the light emitting diode EL, and the sensing thin film transistor ST has been described as an example, each subpixel can have a structure of 3T2C, 4T2C, 5T1C, 6T2C, etc. when the compensation circuit CC is added thereto.

Figure 4:
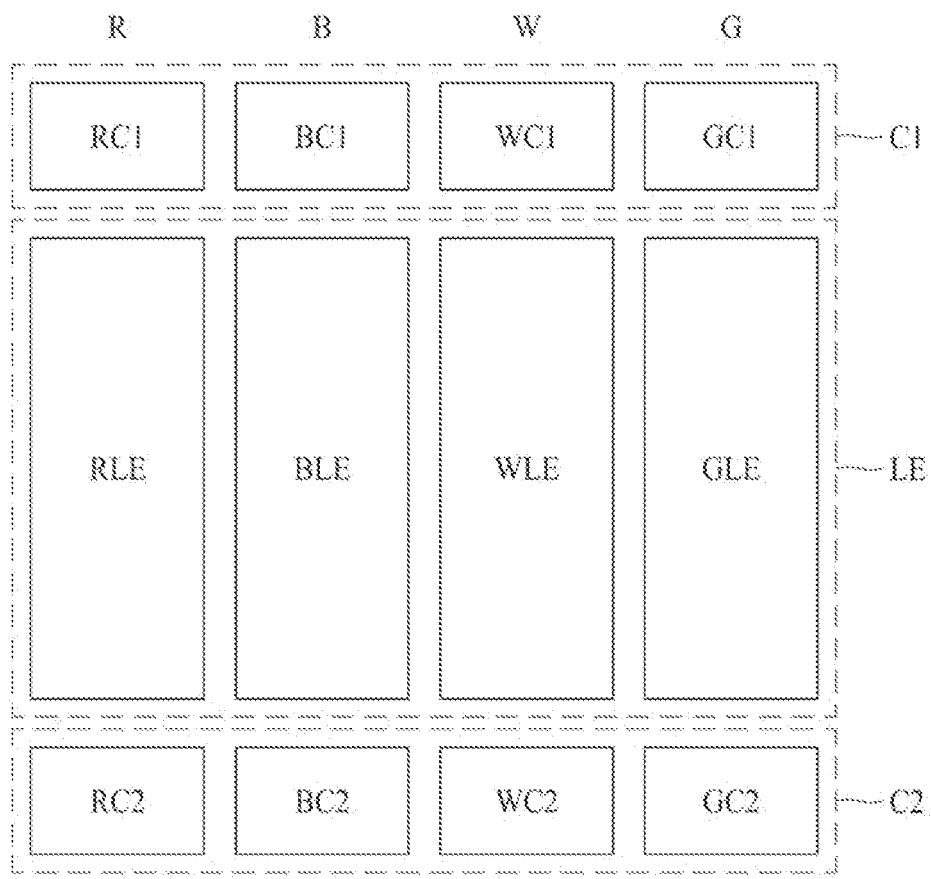
FIG. 4 is a schematic plane view illustrating a unit pixel of a display device according to various embodiments of the present disclosure.

FIG. 4 is a schematic plane view illustrating a unit pixel of a display device according to various embodiments of the present disclosure. FIG. 4 briefly illustrates a unit pixel comprised of the subpixels of FIG. 3.

Referring to FIG. 4, a unit pixel of the display device according to various embodiments of the present disclosure can be comprised of first to fourth subpixels R, B, W and G including a red subpixel R, a blue subpixel B, a white subpixel W and a green subpixel G. However, the present disclosure is not limited to this example of FIG. 4, and the unit pixel can be comprised of first to third subpixels R, G and B including a red subpixel R, a green subpixel G and a blue subpixel B. Further, various modifications can be made in arrangement of at least three or four subpixels included in the unit pixel. In the following description, a 3T1C subpixel will be described as an example.

Each of the first to fourth subpixels R, B, W and G can include an opening area LE where a light emission area is positioned, and first and second circuit areas C1 and C2 respectively disposed at both sides (for example, upper side and lower side of the drawing) of the opening area (or light emission area) LE. For example, in the display device according to various embodiments of the present disclosure, the first circuit area C1 and the second circuit area C2 in each of the subpixels R, B, W and G can be separated from each other based on the opening area LE.

In the display device according to various embodiments of the present disclosure, driving thin film transistors DR included in the first to fourth subpixels R, B, W and G can respectively be disposed in first circuit areas RC1, BC1, WC1 and GC1, and switching thin film transistors SW and sensing thin film transistors ST can respectively be disposed in second circuit areas RC2, BC2, WC2 and GC2, and storage capacitors Cst can respectively be overlapped with opening areas RLE, BLE, WLE and GLE and disposed between the first circuit areas RC1, BC1, WC1 and GC1 and the second circuit areas RC2, BC2, WC2 and GC2.

Since the display device according to various embodiments of the present disclosure includes a first circuit area C1 and a second circuit area C2 at both upper and lower sides based on the opening area LE of the subpixels R, B, W and G, the subpixels R, B, W and G of different rows adjacent to one another can disposed in a mirror shape to share a line common among them, whereby an effect for increasing an aperture ratio can be obtained.

Figure 5:
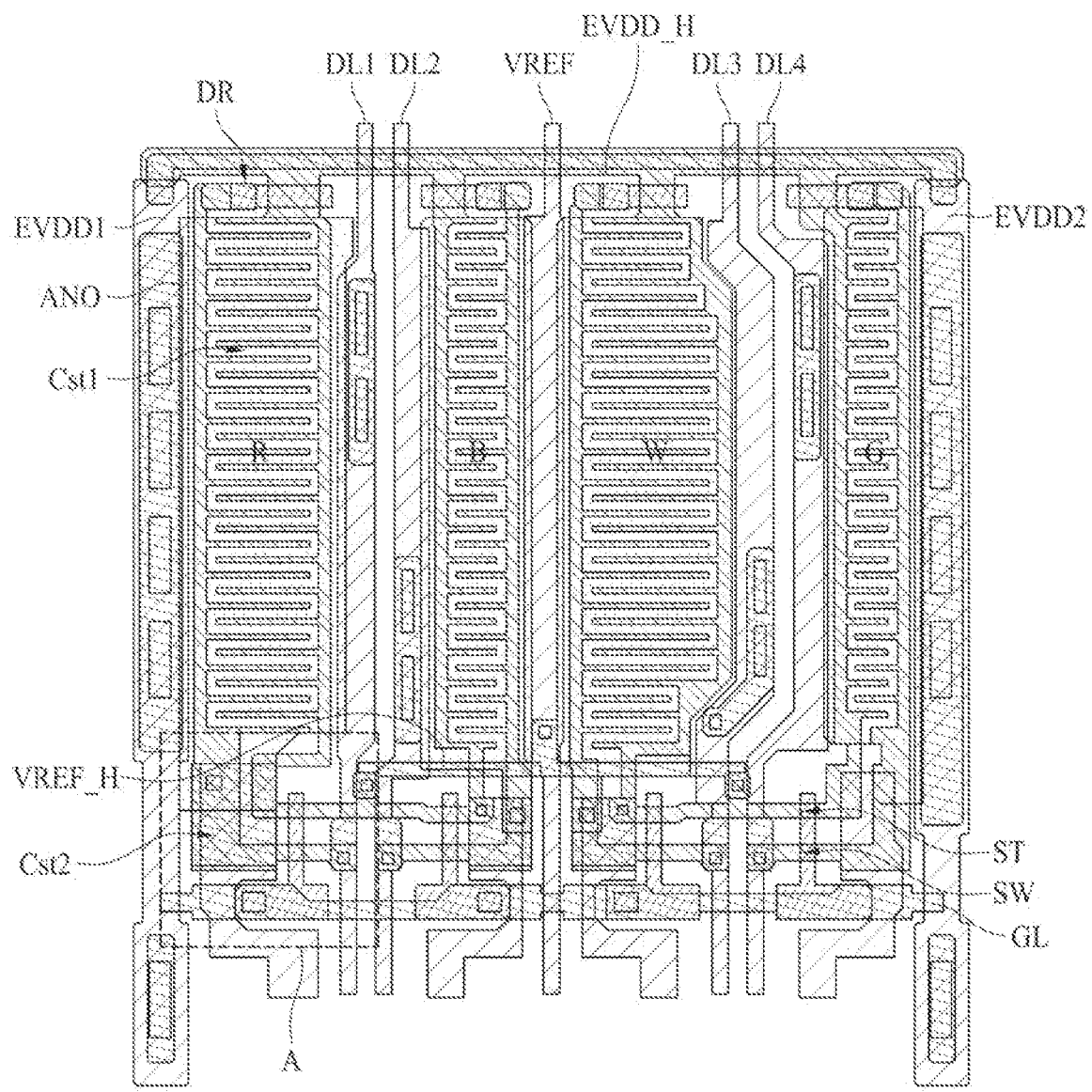
FIG. 5 is a plane view illustrating a unit pixel of a display device according to various embodiments of the present disclosure.

FIG. 5 is a plane view illustrating a unit pixel of a display device according to various embodiments of the present disclosure. FIG. 5 illustrates the unit pixel of the display device of FIG. 4 in more detail.

Referring to FIG. 5, the display device according to various embodiments of the present disclosure can include first to fourth subpixels R, B, W and G constituting one unit pixel.

The respective subpixels R, B, W and G can be defined by intersection between gate lines GL and data lines DL, and can include a light emitting diode PXL, a driving thin film transistor DR, a sensing thin film transistor ST, a switching thin film transistor ST, a first storage capacitor Cst1, and a second storage capacitor Cst2.

A first electrode ANO of the light emitting diode PXL and the first storage capacitor Cst1 can be disposed in an opening area (or light emission area).

The driving thin film transistor DR can be disposed in the first circuit area disposed at one side (e.g., upper side of the opening area) of the opening area, and the sensing thin film transistor ST, the switching thin film transistor SW and the second storage capacitor Cst2 can be disposed in the second circuit area disposed at the other side (e.g., lower side of the opening area) of the opening area.

The respective subpixels R, B, W and G can include an opening area (or light emission area) where the first storage capacitor Cst1, a color filter CF, and the light emitting diode PXL are disposed, a first circuit area disposed at one side (e.g., upper side of the opening area) of the opening area, including the driving thin film transistor DR, and a second circuit area disposed at the other side (e.g., lower side of the opening area) of the opening area, including the sensing thin film transistor ST, the switching thin film transistor SW and the second storage capacitor Cst2.

Four first to fourth subpixels R, B, W and G constituting one unit pixel can be separated from a unit pixel adjacent thereto by using a plurality of pixel power lines EVDD1 and EVDD2 as boundaries. For example, the plurality of power lines EVDD1 and EVDD2 can respectively be disposed at a left side of the first subpixels R and a right side of the fourth subpixels G, which are arranged in a second direction (e.g., vertical direction). A pixel power sharing line EVDD_H extended in a first direction and electrically connected with the pixel power lines EVDD1 and EVDD2 of left and right sides can be included between the plurality of pixel power lines EVDD1 and EVDD2. The pixel power sharing line EVDD_H can be connected to the driving thin film transistors DR disposed in the first circuit area of the first to fourth subpixels R, B, W and G through the pixel power sharing line EVDD_H.

The data lines DL1 to DL4 can be disposed in parallel between the first and second subpixels R and B and between the third and fourth subpixels W and G, which are arranged in the second direction. Each of the data lines DL1 to DL4 can supply the data signal to the switching thin film transistors SW disposed in the second circuit area of the subpixels R, B, W and G adjacent thereto.

Gate lines GL disposed to be extended along the first direction can be included at the position corresponding to the second circuit area of the respective subpixels R, B, W and G.

The reference line VREF can be disposed to be parallel with the plurality of pixel power lines EVDD1 and EVDD2 between the second subpixels B and the third subpixels W, which are arranged in the second direction. The reference line VREF can include a second power sharing line VREF_H extended toward left and right sides in a horizontal direction. The second power sharing line VREF_H can be formed to be extended to left and right sides based on the center connected with the reference line. The reference line VREF can be connected to the sensing thin film transistors ST, which are disposed in the second circuit area of the first to fourth subpixels R, B, W and G, through the second power sharing line VREF_H.

Figure 6:
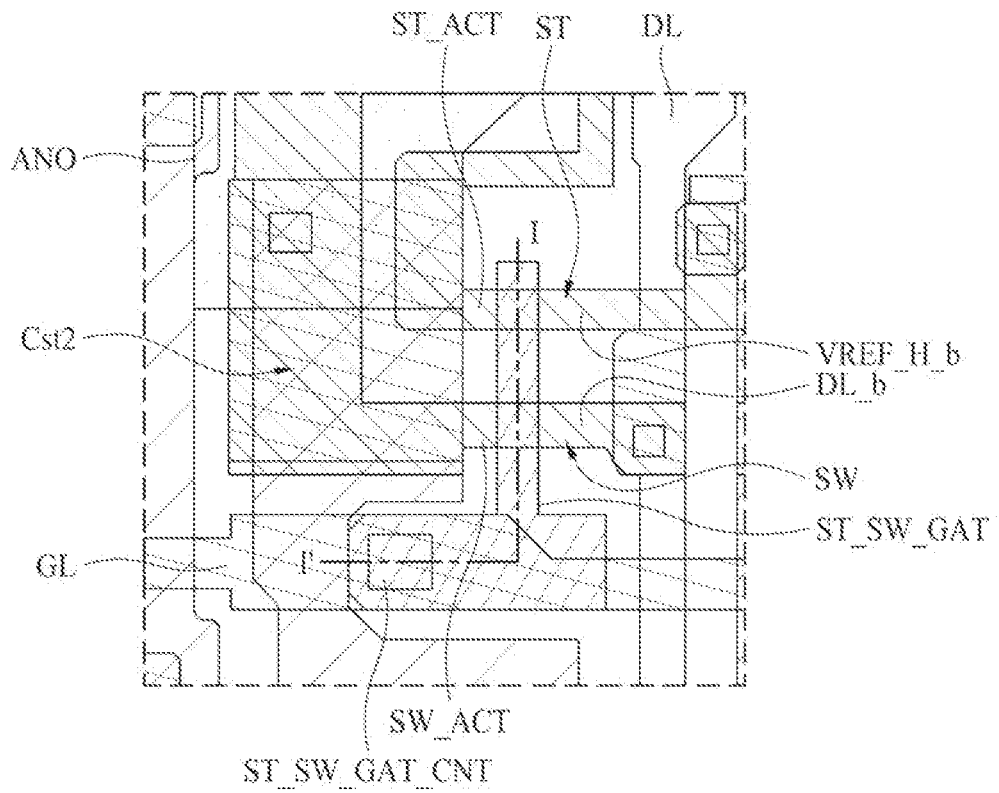
FIG. 6 is an enlarged view of a portion A of FIG. 5.
Figure 7:
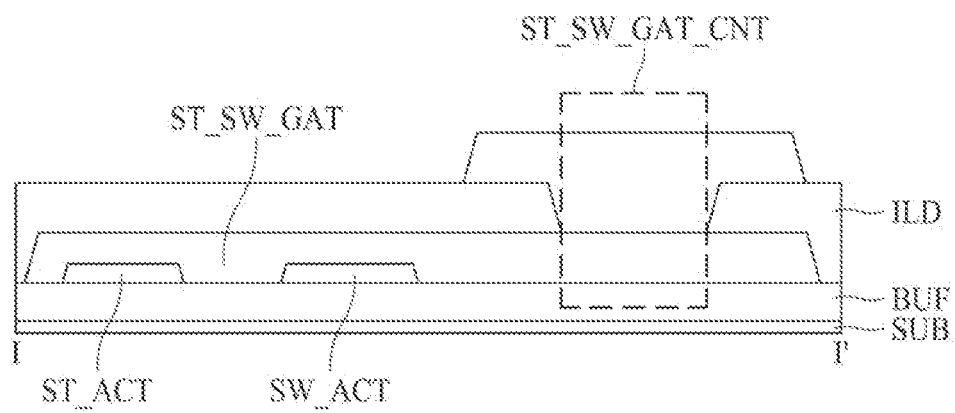
FIG. 7 is a cross-sectional view taken along line I-I' of FIG. 6.

FIG. 6 is an enlarged view of a portion A of FIG. 5. FIG. 7 is a cross-sectional view taken along line I-I' of FIG. 6. These drawings are intended to specifically describe the sensing and switching thin film transistors in the display device according to various embodiments of the present disclosure.

Referring to FIGS. 6 and 7 in connection with FIG. 5, in the second circuit area of each of the subpixels R, B, W and G in the display device according to various embodiments of the present disclosure, a protrusion electrode ST_SW_GAT protruded from the gate line GL can be formed along a length direction of the data line DL. The protrusion electrode ST_SW_GAT can be the gate electrode commonly used in the sensing thin film transistor ST and the switching thin film transistor SW.

The sensing thin film transistor ST and the switching thin film transistor SW can be disposed in parallel in a horizontal direction crossing the protrusion electrode ST_SW_GAT.

The sensing thin film transistor ST can be connected to the gate line GL, the reference line VREF and the source electrode of the driving thin film transistor DR. The sensing thin film transistor ST can include a reference line connection pattern VREF_H_b extended in a horizontal direction crossing the protrusion electrode ST_SW_GAT and connected to the reference sharing line VREF_H. The reference line connection pattern VREF_H_b can be formed as an active layer ST_ACT extended from the sensing thin film transistor ST. For example, the active layer can be conductorized to serve as the reference line connection pattern VREF_H_b.

The switching thin film transistor SW can be connected to the gate line GL, the data line DL and the gate electrode of the driving thin film transistor DR. The switching thin film transistor SW can include a data line connection pattern DL_b extended in a horizontal direction crossing the protrusion electrode ST_SW_GAT and connected to the data line DL. The data line connection pattern DL_b can be formed as an active layer SW_ACT extended from the switching thin film transistor SW. For example, the active layer can be conductorized to serve as the data line connection pattern DL_b. Meanwhile, although FIGS. 5 and 6 show that the sensing thin film transistor ST is disposed at an upper portion and the switching thin film transistor SW is disposed at a lower portion, various embodiments of the present disclosure are not limited to the examples of FIGS. 5 and 6, the switching thin film transistor SW can be disposed at the upper portion and the sensing thin film transistor ST can be disposed at the lower portion.

An auxiliary capacitor Cst2 can be formed in the second circuit area of each of the subpixels R, B, W and G. The auxiliary capacitor Cst2 can be formed between the gate electrode of the driving thin film transistor DR and the source electrode of any one of the sensing thin film transistor ST and the switching thin film transistor SW.

Referring to FIG. 7, a buffer layer BUF, an active layer ST_ACT of the sensing thin film transistor ST, an active layer SW_ACT of the switching thin film transistor SW, a protrusion electrode ST_SW_GAT, an inter-layer dielectric film ILD, and a source/drain electrode SD can be disposed on a substrate SUB.

The active layer ST_ACT of the sensing thin film transistor ST can be formed in parallel with the gate line GL and connected with the reference sharing line VREF_H, and the active layer SW_ACT of the switching thin film transistor SW can be formed in parallel with the active layer ST_ACT of the sensing thin film transistor ST and connected with the data line DL. On the section, the active layer ST_ACT and the active layer SW_ACT can be spaced apart from each other on the buffer layer BUF and disposed to be parallel with each other.

The protrusion electrode ST_SW_GAT can be formed to be protruded from the gate line GL along the length direction of the data line DL. The protrusion electrode ST_SW_GAT can be formed to overlap the active layer ST_ACT of the sensing thin film transistor ST and the active layer SW_ACT of the switching thin film transistor SW, and can be connected with the gate line GL through a contact hole ST_SW_GAT_CNT.

The protrusion electrode ST_SW_GAT can commonly be connected to the active layer ST_ACT of the sensing thin film transistor ST and the active layer SW_ACT of the switching thin film transistor SW, and thus can serve as a gate electrode that can commonly transfer a signal of the gate line GL to the sensing thin film transistor ST and the switching thin film transistor SW.

In the display device according to various embodiments of the present disclosure, the protrusion electrode ST_SW_GAT extended from the gate line GL can be used as the gate electrode to constitute the sensing thin film transistor ST and the switching thin film transistor SW, whereby structures of the sensing and switching thin film transistors ST and SW can be simplified. The reference line connection pattern VREF_H_b between the sensing thin film transistor ST and the reference line VREF and the data line connection pattern DL_b between the switching thin film transistor SW and the data line DL can be disposed to be parallel with each other and simultaneously subjected to repair cutting in a length direction of the protrusion electrode ST_SW_GAT when a dark defect occurs, whereby an improved repair structure can be embodied.

Figure 8:
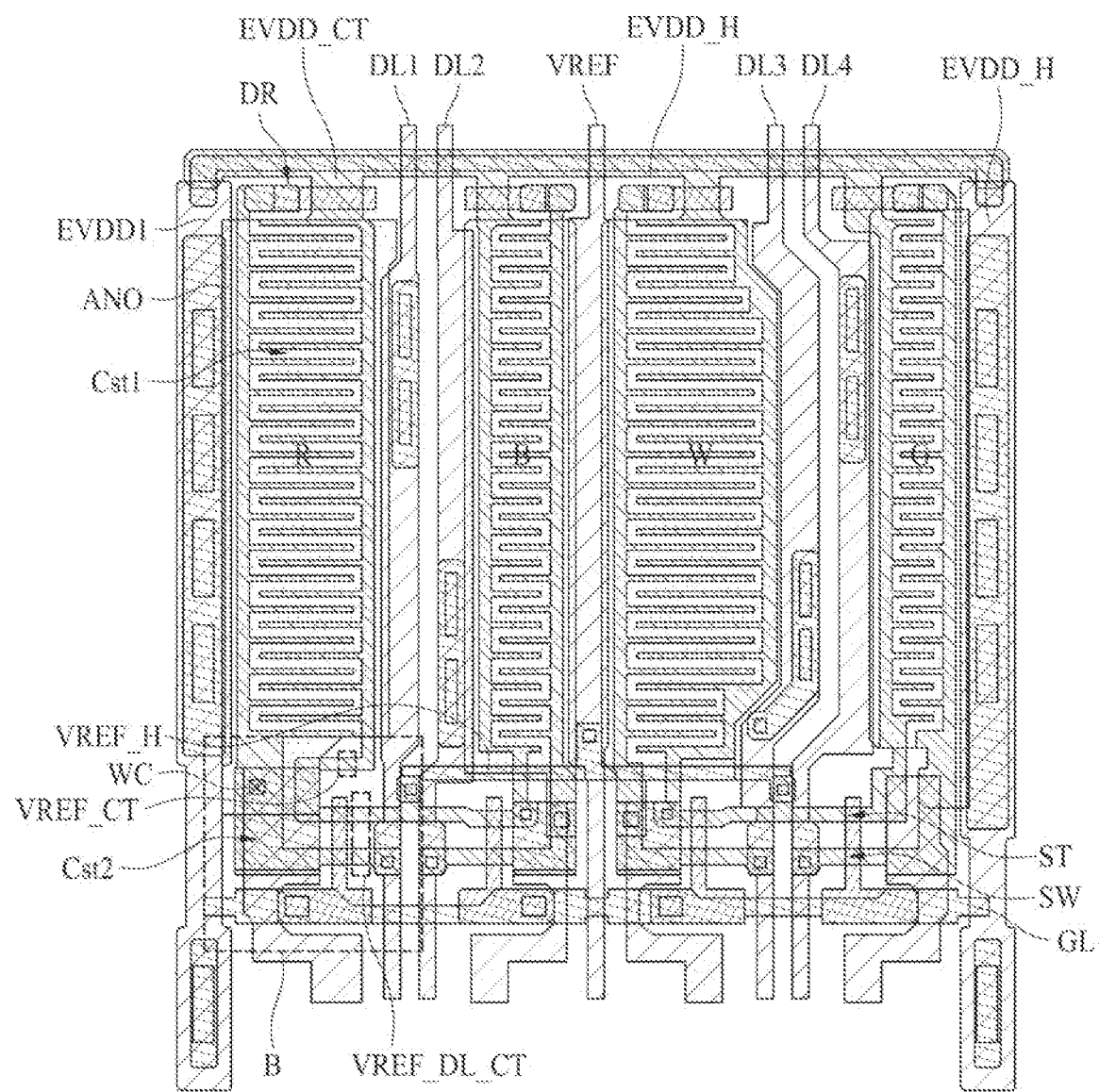
FIG. 8 is a view illustrating a repair process of a display device according to various embodiments of the present disclosure.
Figure 9:
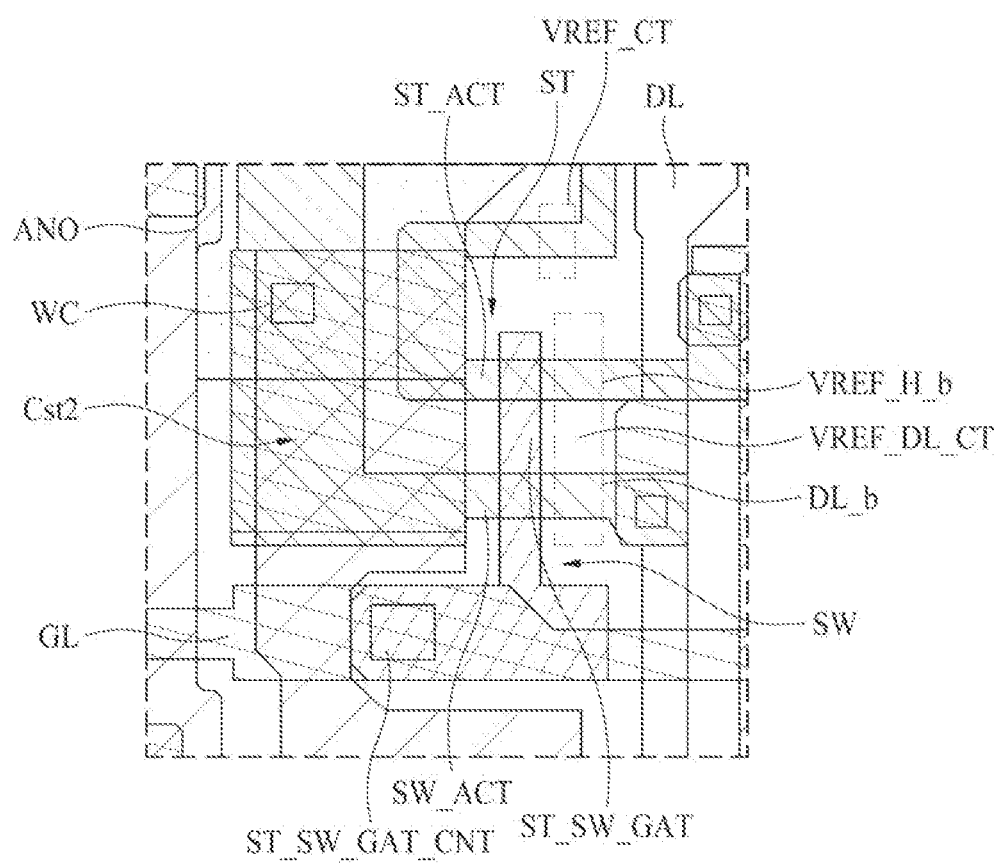
FIG. 9 is an enlarged view of a portion B of FIG. 8.

FIG. 8 is a view illustrating a repair process of a display device according to various embodiments of the present disclosure. FIG. 9 is an enlarged view of a portion B of FIG. 8.

Referring to FIGS. 8 and 9, the display device can include first to fourth subpixels R, B, W and G constituting one unit pixel. For example, when a dark defect occurs, in which red light of the first subpixel R among the subpixels R, B, W and G is not displayed normally, the first subpixel R can be separated from the other subpixels B, W and G, whereby the defect can be repaired. To this end, repair cutting EVDD_CT can be performed between the driving thin film transistor DR of the first subpixel R and the pixel power line EVDD, ad repair cutting EVDD_CT can be performed between the driving transistor DR and the reference line VREF. Further, repair cutting VREF_CT can be performed between the sensing thin film transistor ST and the reference line VREF and between the switching thin film transistor SW and the data line DL. Further, the first electrode ANO of the light emitting diode can be subjected to welding WC by a laser.

As shown in FIG. 9, in the repair process according to various embodiments of the present disclosure, the reference line connection pattern VREF_H_b between the sensing thin film transistor ST and the reference line VREF and the data line connection pattern DL_b between the switching thin film transistor SW and the data line DL can simultaneously be subjected to repair cutting VREF_DL_CT in the length direction of the protrusion electrode ST_SW_GAT and thus the sensing thin film transistor ST and the reference line VREF and the switching thin film transistor SW and the data line DL can be separated from each other. The reference line connection pattern VREF_H_b and the data line connection pattern DL_b can be cut by repair cutting VREF_DL_CT of only one time. For example, the reference line connection pattern VREF_H_b and the data line connection pattern DL_b can be formed as active layers. Alternatively, the reference line connection pattern VREF_H_b and the data line connection pattern DL_b can be formed in an active multi-layered structure in which an active layer and a metal material layer are deposited. For example, the active multi-layered structure can be comprised of a tripe layer of active layer/MoTi/Cu, or a double layer of active layer/MoTi. According to various embodiments, repair cutting VREF_CT between the driving transistor DR and the reference line VREF can also be performed during repair cutting VREF_DL_CT of the sensing thin film transistor ST and the switching thin film transistor SW. For example, repair cutting can be performed using a laser cutting device of a wavelength range of 1064 nm.

Figure 10:
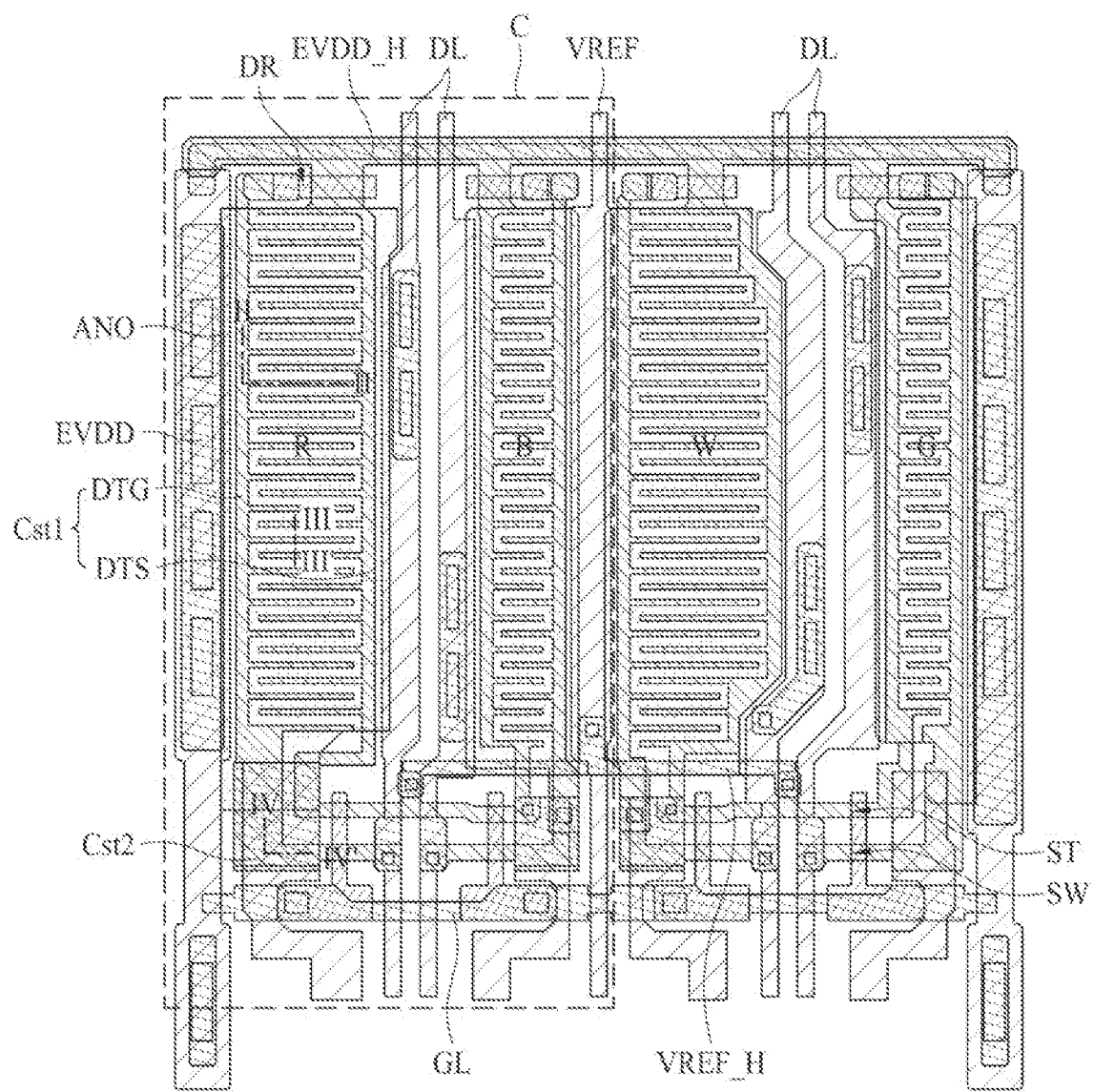
FIG. 10 is a plane view illustrating a unit pixel of a display device according to various embodiments of the present disclosure.
Figure 11:
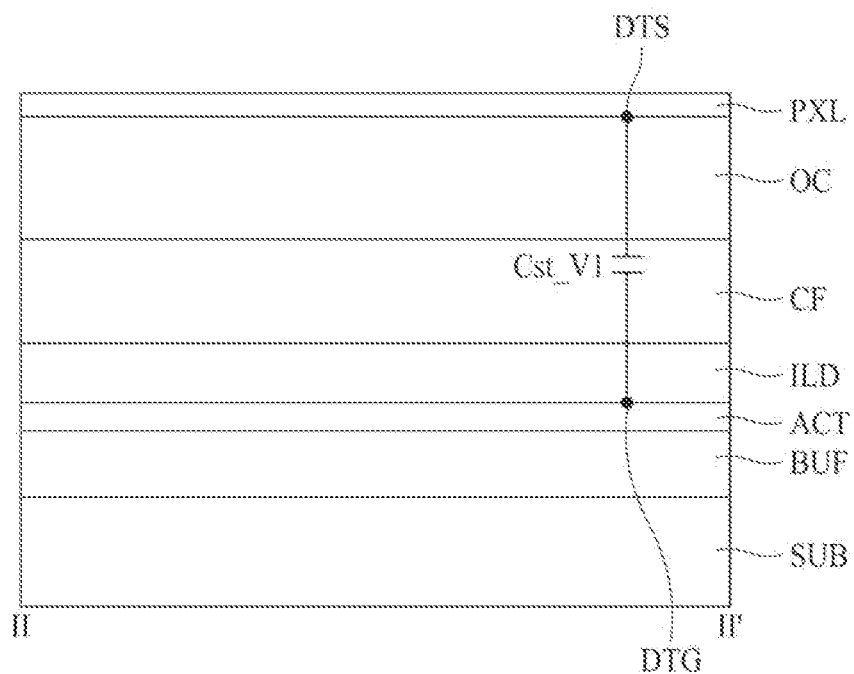
FIG. 11 is a cross-sectional view taken along line II-II' of FIG. 10.
Figure 12:
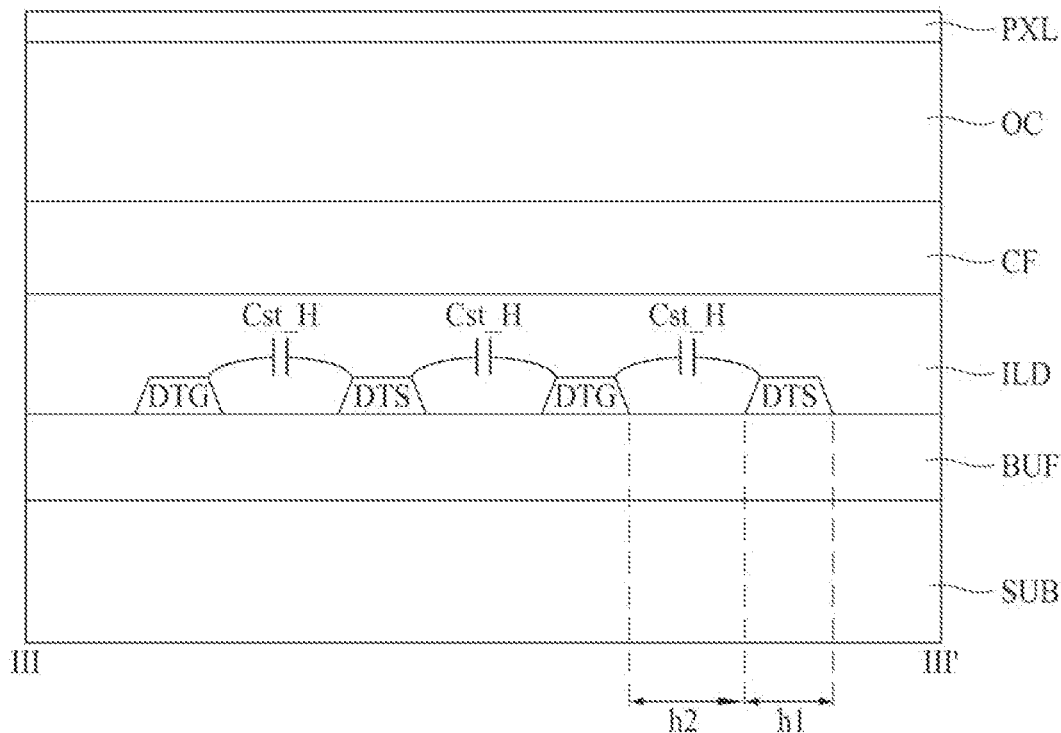
FIG. 12 is a cross-sectional view taken along line of FIG. 10.
Figure 13:
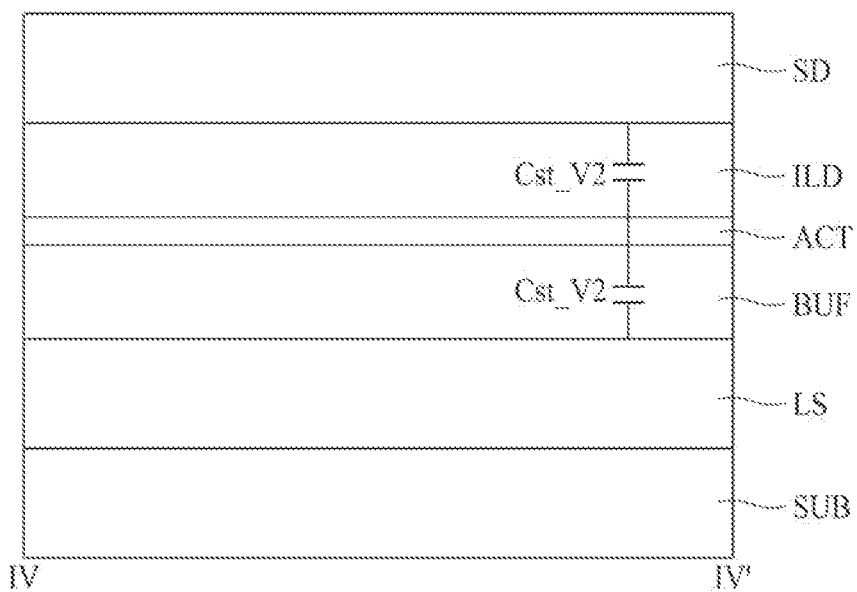
FIG. 13 is a cross-sectional view taken along line IV-IV' of FIG. 10.
Figure 14:
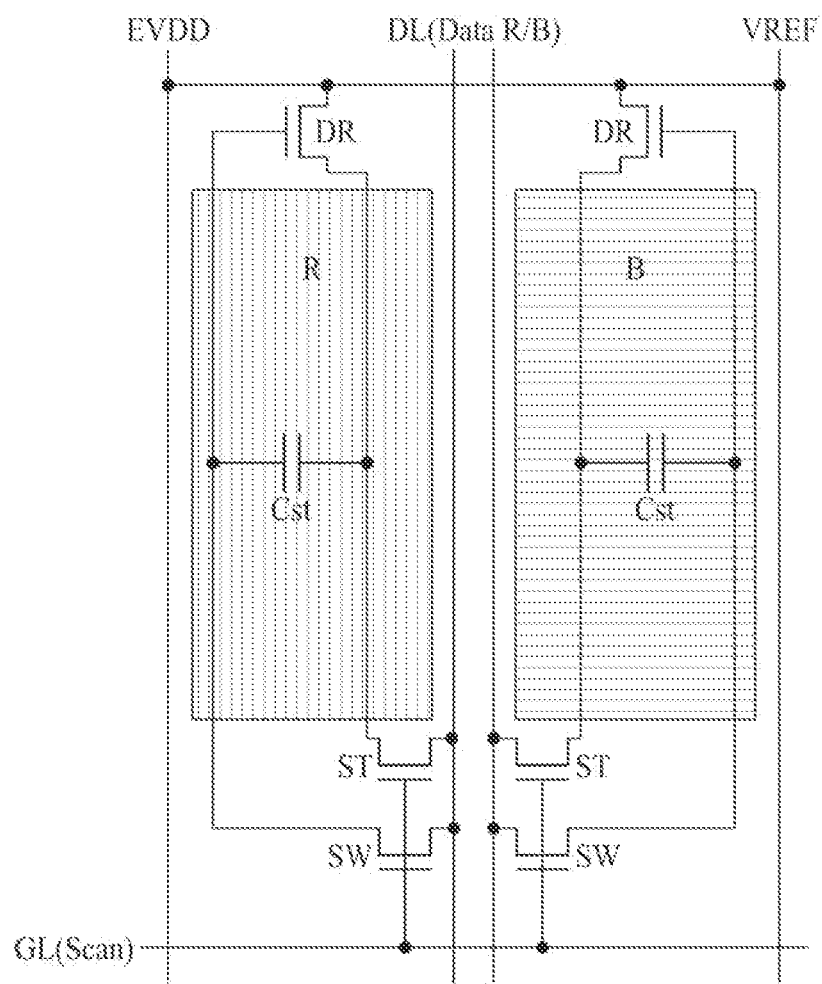
FIG. 14 is an equivalent circuit view illustrating a storage capacitor of subpixels of a portion C of FIG. 10.

FIG. 10 is a plane view illustrating a unit pixel of a display device according to various embodiments of the present disclosure. FIG. 11 is a cross-sectional view taken along line II-II' of FIG. 10. FIG. 12 is a cross-sectional view taken along line III-III' of FIG. 10. FIG. 13 is a cross-sectional view taken along line IV-IV' of FIG. 10. FIG. 14 is an equivalent circuit view illustrating a storage capacitor of subpixels of a portion C of FIG. 10. This drawing is intended to specifically describe the storage capacitor Cst in the display device according to various embodiments of the present disclosure. Therefore, in the following description, a repeated description of the other same elements except the description of the storage capacitor Cst will be omitted or may be provided briefly.

As shown in FIG. 10, the respective subpixels R, B, W and G can be defined by intersection between the gate lines GL and the data lines DL, and can include a light emitting diode PXL, a driving thin film transistor DR, a sensing thin film transistor ST, a switching thin film transistor ST, a first storage capacitor Cst1, and a second storage capacitor Cst2.

A first electrode ANO of the light emitting diode PXL and the first storage capacitor Cst1 can be disposed in an opening area (or light emission area).

The driving thin film transistor DR can be disposed in the first circuit area disposed at one side (e.g., upper side of the opening area) of the opening area, and the second storage capacitor Cst2 can be disposed in the second circuit area disposed at the other side (e.g., lower side of the opening area) of the opening area.

As shown in FIG. 11, in the opening area of each of the subpixels R, B, W and G, a buffer layer BUF, an active layer ACT, an inter-layer dielectric film ILD, a color filter CF, an over coat layer OC and a light emitting diode PXL can be disposed on a substrate SUB.

The buffer layer BUF can be formed on an entire surface of the substrate SUB, and the active layer ACT on the buffer layer BUF can be connected to any one of the gate electrode and the source electrode of the driving thin film transistor DR. For example, in FIG. 11, the active layer ACT can be the first electrode pattern DTG conductorized by being connected to the gate electrode of the driving thin film transistor DR. Alternatively, the active layer ACT can be the second electrode pattern DTS conductorized by being connected to the source electrode of the driving thin film transistor DR.

The inter-layer dielectric film ILD, the color filter CF, the overcoat layer OC, and the light emitting diode PXL can be formed on the active layer ACT.

The first electrode pattern DTG formed by conductorization of the active layer ACT and the first electrode ANO of the light emitting diode PXL can be spaced apart from each other by interposing the inter-layer dielectric film ILD, the color filter CF, and the overcoat layer OC, whereby a vertical capacitor Cst_V1 can be formed in a vertical direction. Alternatively, the vertical capacitor Cst_V1 can be formed in a vertical direction between the second electrode pattern DTS formed by conductorization of the active layer ACT and the first electrode ANO of the light emitting diode PXL.

As shown in FIG. 12, in the opening area of each of the subpixels R, B, W and G, the buffer layer BUF, the active layer ACT, the inter-layer dielectric film ILD, the color filter CF, the overcoat layer OC and the light emitting diode PXL can be disposed on the substrate SUB.

The buffer layer BUF can be formed on the entire surface of the substrate SUB, and the active layer ACT on the buffer layer BUF can be connected to any one of the gate electrode and the source electrode of the driving thin film transistor DR. For example, in FIG. 12, the active layer ACT can be a finger pattern structure in which each of a plurality of first electrode patterns DTG conductorized by being connected to the gate electrode of the driving thin film transistor DR and each of a plurality of second electrode patterns DTS conductorized by being connected to the source electrode of the driving thin film transistor DR are disposed on the same plane in parallel. A width h1 of each of the plurality of first and second electrode patterns DTG and DTS can be smaller than a width h2 between the first and second electrode patterns DTG and DTS.

The plurality of first electrode patterns DTG and the plurality of second electrode patterns DTS, which are formed by conductorization of the active layer ACT, can be disposed alternately, whereby a horizontal capacitor Cst_H can be formed in a horizontal direction between the first and second electrode patterns.

Referring to FIGS. 11 and 12, a first storage capacitor Cst1, which includes the vertical capacitor Cst_V1 shown in FIG. 11 and the horizontal capacitor Cst_H shown in FIG. 12, can be formed in the opening area of each of the subpixels R, B, W and G. For example, based on the red subpixel R, the first storage capacitor Cst1 of the opening area can be a capacitor in which the vertical capacitor Cst_V1 and the horizontal capacitor Cst_H are combined with each other.

As shown in FIG. 13, in the second circuit area of each of the subpixels R, B, W and G, a light-shielding layer LS, the buffer layer BUF, the active layer ACT, the inter-layer dielectric film ILD and a source/drain electrode SD can be disposed on the substrate SUB.

The light-shielding layer LS can be disposed on the substrate SUB to overlap the active layer ACT and the source/drain electrode SD. The active layer ACT on the buffer layer BUF can be connected to any one of the gate electrode and the source electrode of the driving thin film transistor DR. For example, in FIG. 13, the active layer ACT can be the first electrode pattern DTG conductorized by being connected to the gate electrode of the driving thin film transistor DR. Alternatively, the active layer ACT can be the second electrode pattern DTS conductorized by being connected to the source electrode of the driving thin film transistor DR.

The inter-layer dielectric film ILD and the source/drain electrode SD can be formed on the active layer ACT. For example, the light-shielding layer LS can be disposed below the active layer ACT by interposing the buffer layer BUF, and the source/drain electrode SD can be disposed above the active layer ACT by interposing the inter-layer dielectric film ILD.

In the first electrode pattern DTG formed by conductorization of the active layer ACT, dual vertical capacitors Cst_V2 can be formed in a vertical direction to each of the light-shielding layer LS therebelow and the source/drain electrode SD thereabove by being spaced apart from the light-shielding layer LS by interposing the buffer layer BUF and being spaced apart from the source/drain electrode SD by interposing the inter-layer dielectric film ILD.

Referring to FIG. 14, in the display device according to various embodiments of the present disclosure, the storage capacitor Cst can be overlapped with the opening areas of the subpixels R and B and formed between the driving thin film transistor DR of the first circuit area and the sensing thin film transistor ST of the second circuit area. For example, based on the red subpixel R, the capacitor, in which the vertical storage capacitor Cst_V1 and the horizontal capacitor Cst_H corresponding to the first storage capacitors Cst1 of the opening area are combined with each other, and the dual vertical capacitors Cst_V2 of a non-opening area (or the second circuit area) can be combined with each other to form the storage capacitor Cst.

FIGS. 15 to 19 are plane views illustrating a single layer structure of a portion of a unit pixel of a display device according to various embodiments of the present disclosure.

Referring to FIGS. 15 to 19, subpixels constituting a unit pixel in the display device according to various embodiments of the present disclosure will be described in more detail.

Figure 15:
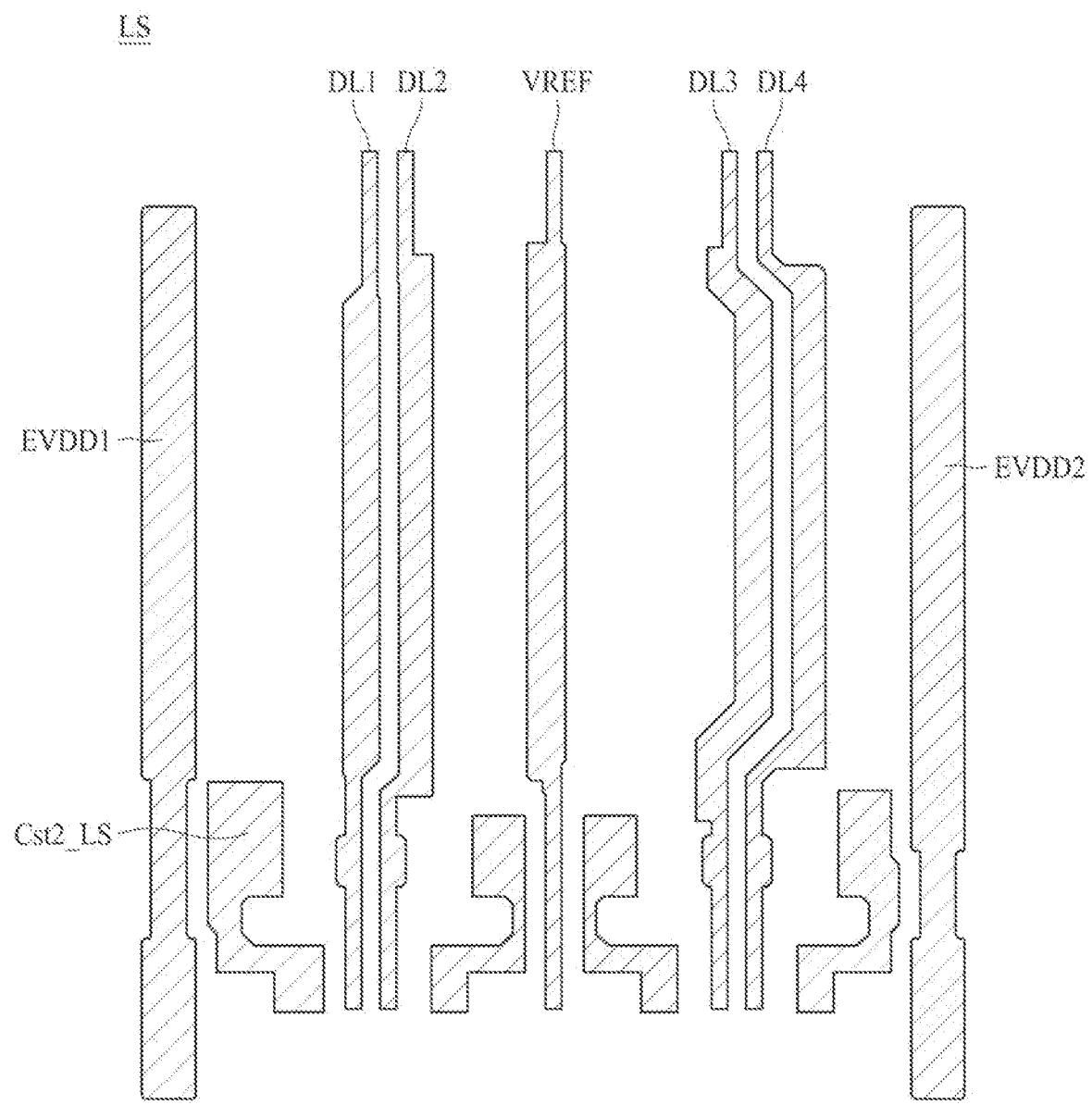
FIGS. 15 to 19 are plane views illustrating a single layer structure of a portion of a unit pixel of a display device according to various embodiments of the present disclosure.

As shown in FIG. 15, a plurality of pixel power lines EVDD1 and EVDD2 arranged to be parallel with each other along a first direction (for example, horizontal direction) and extended in a second direction (for example, vertical direction) crossing the first direction, first and second data lines DL1 and DL2 and third and fourth data lines DL3 and DL4 disposed to be adjacent to each other in parallel with the plurality of pixel power lines EVDD1 and EVDD2 between the pixel power lines EVDD1 and EVDD2, and a reference line VREF disposed to be parallel with the second and third data lines DL2 and DL3 between the second and third data lines DL2 and DL3 can be formed on the substrate. The plurality of pixel power lines EVDD1 and EVDD2, the data lines DL1 to DL4 and the reference line VREF can be formed by the light-shielding layer LS.

A light-shielding pattern Cst2_LS corresponding to the sensing thin film transistor ST and the switching thin film transistor SW formed in the second circuit areas of the first to fourth subpixels R, B, W and G and forming the second storage capacitor Cst2 can be disposed.

The buffer layer BUF can be disposed on the substrate, on which the elements shown in FIG. 15 are formed, to cover the elements. The buffer layer BUF can serve to protect the thin film transistor formed by a subsequent process from impurities such as alkali ion leaking from the light-shielding layer LS or the substrate. The buffer layer BUF can be a silicon oxide (SiOx), a silicon nitride (SiNx) or a multi-layer of SiOx and SiNx.

Figure 16:
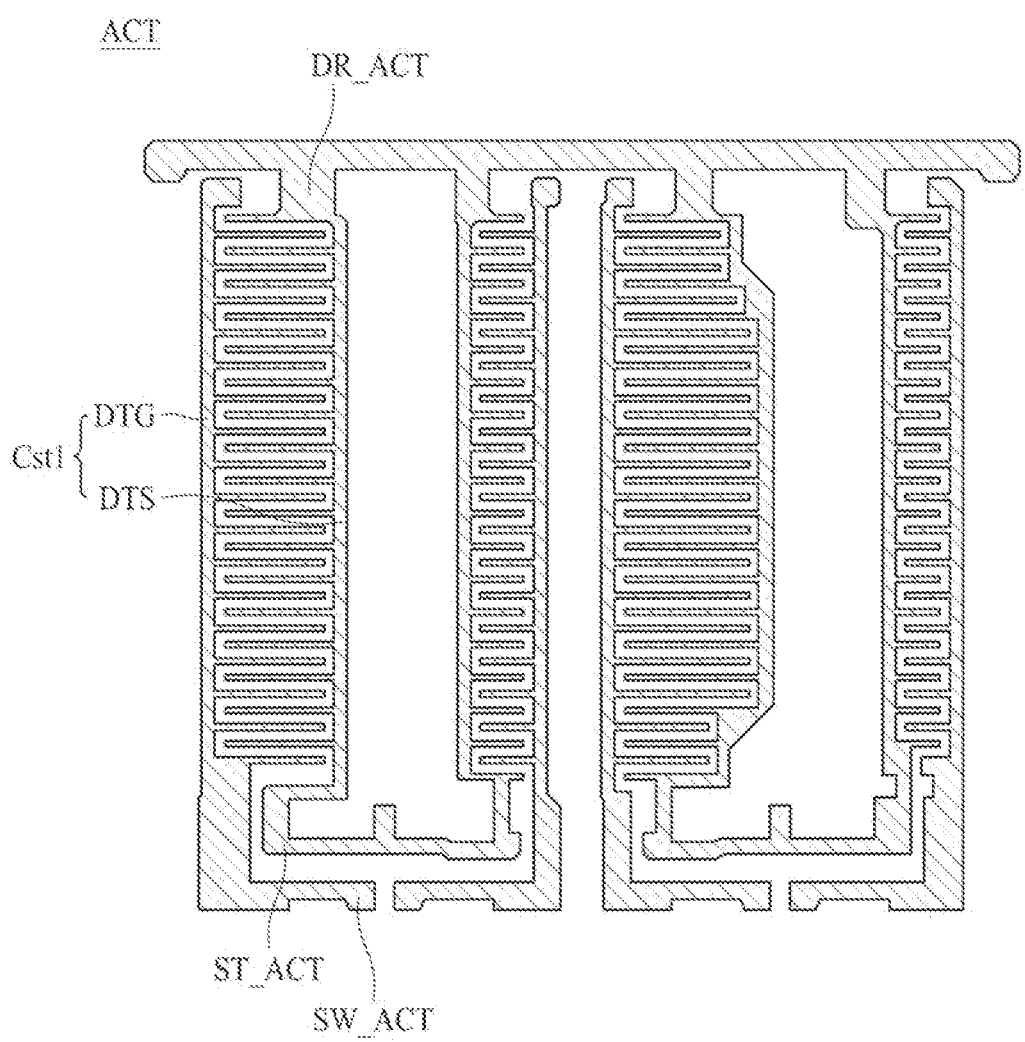

As shown in FIG. 16, the active layer ACT can be disposed on the buffer layer BUF.

The active layer ACT can include an active layer DR_ACT of the driving thin film transistor DR disposed in first circuit areas RC1, BC1, WC1 and GC1 of the respective subpixels R, B, W and G, an active layer ST_ACT of the sensing thin film transistor ST disposed in second circuit areas RC2, BC2, WC2 and GC2, and an active layer SW_ACT of the switching thin film transistor SW. Further, the active layer ACT can include an active layer constituting a first electrode pattern DTG and a second electrode pattern DTS, which are disposed in the opening areas of the respective subpixels R, B, W and G. In the active layer ACT, a portion connected with the gate electrode of the driving thin film transistor DR of the first circuit area, a portion constituting the first electrode pattern DTG in the opening area, and a portion constituting the switching thin film transistor SW of the second circuit area can be formed in a single body. Also, in the active layer ACT, a portion connected with the source electrode of the driving thin film transistor DR of the first circuit area, a portion constituting the second electrode pattern DTS in the opening area, and a portion constituting the sensing thin film transistor ST of the second circuit area can be formed in a single body. Further, the active layer ACT can include a common active layer formed to partially overlap the pixel power lines EVDD1 and EVDD2 while overlapping the pixel power sharing line EVDD_H which will be formed between the pixel power lines EVDD1 and EVDD2.

Each of the first electrode pattern DTG and the second electrode pattern DTS of the active layer ACT in the opening area can be formed in a first common pattern, a second common pattern, and a plurality of first and second electrode patterns respectively connected to the first common pattern and the second common pattern and disposed in parallel in a finger pattern structure.

Figure 17:
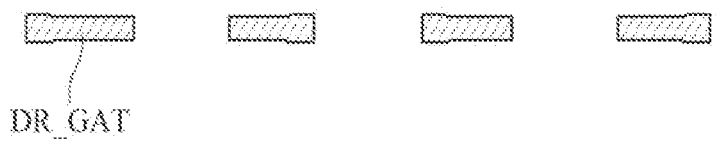
Figure 17:
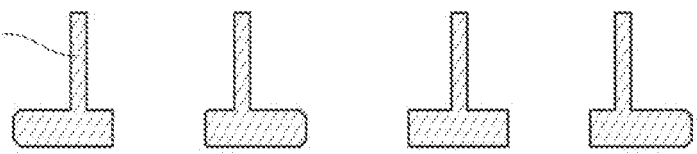

As shown in FIG. 17, a gate electrode DR_GAT for constituting the driving thin film transistor DR can be formed in the first circuit areas of the first to fourth subpixels R, B, W and G, and a protrusion electrode ST_SW_GAT for common use in the sensing thin film transistor ST and the switching thin film transistor SW can be disposed in the second circuit areas. The protrusion electrode ST_SW_GAT can be formed to be extended from the gate line GL in the length direction of the data line DL.

The inter-layer dielectric film ILD can be disposed on the substrate on which the elements shown in FIG. 17, to cover the elements. The inter-layer dielectric film ILD can be a silicon oxide (SiOx), a silicon nitride (SiNx) or a multi-layer of SiOx and SiNx.

Figure 18:
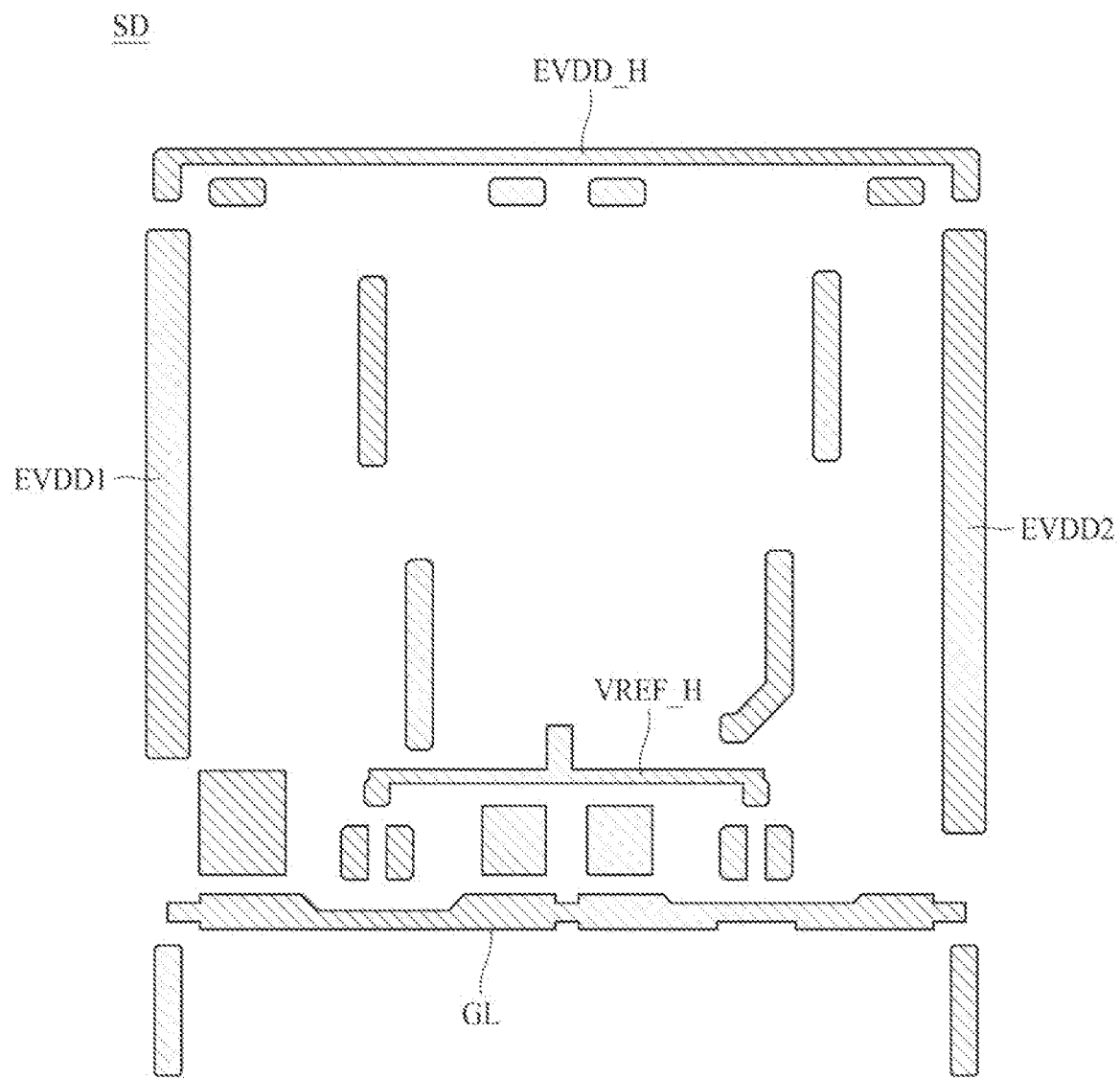

As shown in FIG. 18, the plurality of first power lines EVDD1 and EVDD2, the pixel power sharing line EVDD_H, the second power sharing line VREF_H, and the gate line GL can be formed on the inter-layer dielectric film ILD. Further, the source/drain electrode SD of the driving thin film transistor DR formed in the first circuit areas of the first to fourth subpixels R, B, W and G and the source/drain electrodes SD of the sensing thin film transistor ST and the switching thin film transistor SW formed in the second circuit areas can be formed.

The elements shown in FIG. 18 can be formed of the same material, and can be a multi-layer made of any one selected from a group of Mo, Al, Cr, Au, Ti, Ni, Nd and Cu, or their alloy. For example, the elements can be made of a double layer of Cu/MoTi.

Further, a passivation film PAS can be disposed to cover all of the elements shown in FIG. 18. The passivation film PAS is an insulating film for protecting elements therebelow, and can be a silicon oxide (SiOx), a silicon nitride (SiNx) or a multi-layer of SiOx and SiNx.

Red, blue, white and green color filters CF can be disposed on the passivation film PAS to correspond to the opening areas of the respective subpixels R, B, W and G. The color filters CF can emit light of red, blue, white and green colors by filtering white light emitted from the light emitting diode PXL.

The overcoat layer OC can be disposed on the color filters CF to cover the color filters CF. The overcoat layer OC can be a planarization film that mitigates a step difference of a lower structure.

Figure 19:
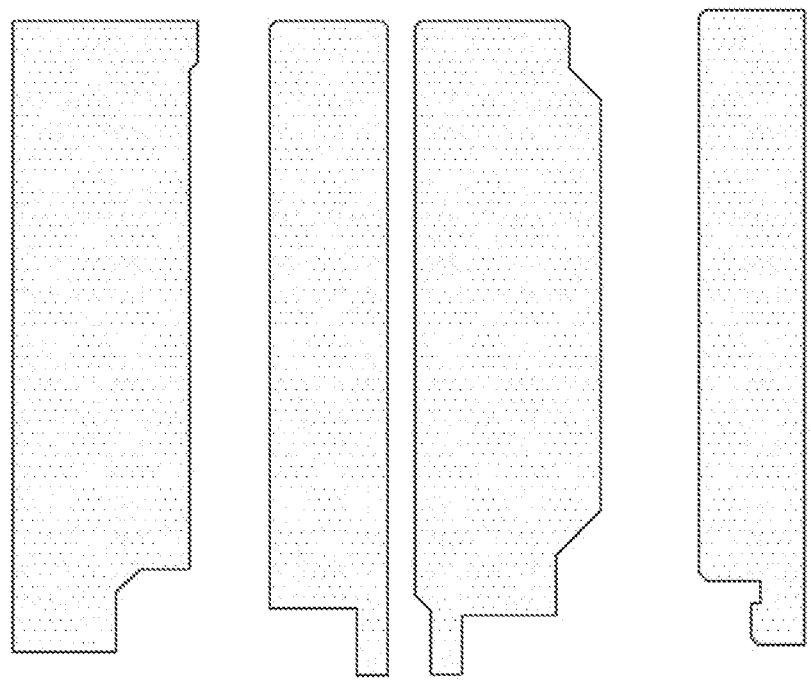

As shown in FIG. 19, the light emitting diodes PXL can be disposed on the overcoat layer OC to correspond to the opening area of each of the subpixels R, B, W and G. The light emitting diodes PXL can include a first electrode (e.g., anode electrode ANO), a light emitting layer, and a second electrode (e.g., cathode electrode). For example, the light emitting diode PXL can be an organic light emitting diode (OLED).

The pixel and the display device including the same according to various embodiments of the present disclosure can be described as follows.

The pixel according to various embodiments of the present disclosure is disposed in a pixel area defined by a gate line, a data line and a pixel power line, and comprises a light emission portion and a pixel circuit, wherein the pixel circuit can include a protrusion electrode protruded from the gate line along a length direction of the data line, and first and second thin film transistors disposed in parallel between the light emission portion and the gate line, using the protrusion electrode as a gate electrode.

In the pixel according to various embodiments of the present disclosure, the first and second thin film transistors can be disposed in a horizontal direction crossing the protrusion electrode.

In the pixel according to various embodiments of the present disclosure, the pixel circuit can further include a driving thin film transistor connected to a first node, a second node and the pixel power line, and a first storage capacitor between the first node and the second node.

In the pixel according to various embodiments of the present disclosure, the pixel circuit can include first and second circuit areas disposed by interposing the light emission portion, the driving thin film transistor can be disposed in the first circuit area, the first and second thin film transistors can be disposed in the second circuit area, and the first storage capacitor can be overlapped with the light emission portion and disposed between the first circuit area and the second circuit area.

In the pixel according to various embodiments of the present disclosure, can further comprise an active layer and a light emitting diode in the light emission portion, the active layer being connected to any one of the first node and the second node of the driving thin film transistor, a first electrode pattern of the active layer conductorized by being connected to the second node of the driving thin film transistor and a second electrode pattern of the active layer conductorized by being connected to the first node of the driving thin film transistor can be spaced apart from a first electrode of the light emitting diode by interposing at least one of an inter-layer dielectric film, a the color filter and an overcoat layer, whereby a vertical capacitor of the first storage capacitor can be formed in a vertical direction.

In the pixel according to various embodiments of the present disclosure, a plurality of the first electrode pattern and a plurality of the second electrode pattern can be disposed alternately on the same plane in parallel, whereby a horizontal capacitor of the first storage capacitor can be formed in a horizontal direction between the first electrode patterns and second electrode patterns.

In the pixel according to various embodiments of the present disclosure, in the active layer, a portion connected with the second node of the driving thin film transistor of the first circuit area, a portion constituting the first electrode pattern in the light emission portion, and a portion constituting a data line connection pattern of the second thin film transistor of the second circuit area can be formed in a single body, and a portion connected with the first node of the driving thin film transistor of the first circuit area, a portion constituting the second electrode pattern in the light emission portion, and a portion constituting a reference line connection pattern of the first thin film transistor of the second circuit area can be formed in a single body.

In the pixel according to various embodiments of the present disclosure, the second circuit area can further include a second storage capacitor disposed between the gate electrode of the driving thin film transistor and a source electrode of any one of the first and second switching thin film transistors.

In the pixel according to various embodiments of the present disclosure can further comprise a reference line to which a reference voltage is applied, wherein the first thin film transistor can be connected to the gate line, the reference line and the source electrode of the driving thin film transistor, and the second thin film transistor can be connected to the gate line, the data line and the gate electrode of the driving thin film transistor.

In the pixel according to various embodiments of the present disclosure, the first thin film transistor can be configured to supply an initialization voltage transferred through the reference line to the first node of the driving thin film transistor or sense the first node of the driving thin film transistor, and the second thin film transistor can be configured to supply a data voltage transferred through the data line to the second node of the driving thin film transistor.

In the pixel according to various embodiments of the present disclosure, the first thin film transistor can include a reference line connection pattern crossing the protrusion electrode and connected to the reference line, and the second thin film transistor can include a data line connection pattern extended in parallel with the reference line connection pattern and connected to the data line.

In the pixel according to various embodiments of the present disclosure, the reference line connection pattern and the data line connection pattern can be formed as a part of an active layer.

In the pixel according to various embodiments of the present disclosure, the reference line connection pattern and the data line connection pattern can be formed of an active multi-layered structure in which an active layer and at least one metal material layer are deposited.

In the pixel according to various embodiments of the present disclosure, the reference line connection pattern and the data line connection pattern can cut by being simultaneously subjected to repair cutting in a length direction of the protrusion electrode when a dark defect occurs.

In the pixel according to various embodiments of the present disclosure, the repair cutting can be also performed between the driving thin film transistor and the pixel power line, and between the driving thin film transistor and the reference line, such that the pixel can be separated from an adjacent pixel.

A display device according to various embodiments of the present disclosure can include a plurality of subpixels disposed in a pixel area defined by a gate line, a data line and a pixel power line, having a light emission portion and a pixel circuit, wherein the pixel circuit can include a driving thin film transistor connected to a first node, a second node and the pixel power line, a first switching thin film transistor connected to the gate line, the data line and the first node between the light emission portion and the gate line, a second switching thin film transistor disposed to be parallel with the first switching thin film transistor between the light emission portion and the gate line and connected to the gate line, a reference line and the second node, a capacitor between the first node and the second node, and a protrusion electrode protruded from the gate line to overlap each of the first and second switching thin film transistors, and the protrusion electrode can be a gate electrode of each of the first and second switching thin film transistors.

In the display device according to various embodiments of the present disclosure, the protrusion electrode can be protruded from the gate line along a length direction of the data line, and the first and second switching thin film transistors can be disposed in parallel in a horizontal direction crossing the protrusion electrode.

In the display device according to various embodiments of the present disclosure, the pixel circuit can include first and second circuit areas disposed by interposing the light emission portion, the driving thin film transistor can be disposed in the first circuit area, the first and second switching thin film transistors can be disposed in the second circuit area, and the capacitor can be overlapped with the light emission portion and disposed between the first circuit area and the second circuit area.

In the display device according to various embodiments of the present disclosure, the second circuit area can further include an auxiliary capacitor disposed between a gate electrode of the driving thin film transistor and a source electrode of any one of the first and second switching thin film transistors.

In the display device according to various embodiments of the present disclosure, the second switching thin film transistor can be connected to the gate line, the reference line, and a source electrode of the driving thin film transistor, and the first switching thin film transistor can be connected to the gate line, the data line and the gate electrode of the driving thin film transistor.

In the display device according to various embodiments of the present disclosure, the second switching thin film transistor can include a reference line connection pattern extended in a horizontal direction crossing the protrusion electrode and connected to the reference line, and the first switching thin film transistor can include a data line connection pattern extended in parallel with the reference line connection pattern and connected to the data line.

In the display device according to various embodiments of the present disclosure, the reference line connection pattern and the data line connection pattern can be formed as an active layer.

In the display device according to various embodiments of the present disclosure, the reference line connection pattern and the data line connection pattern can be formed of an active multi-layered structure in which an active layer and at least one metal material layer are deposited.

In the display device according to various embodiments of the present disclosure, the reference line connection pattern and the data line connection pattern can be cut by being simultaneously subjected to repair cutting in a length direction of the protrusion electrode when a dark defect occurs.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A pixel disposed in a pixel area defined by a gate line, a data line and a pixel power line, the pixel comprising a light emission area and a pixel circuit,
   wherein the pixel circuit includes:
   a protrusion electrode protruded from the gate line along a length direction of the data line; and
   a first thin film transistor and a second thin film transistor disposed in parallel to the gate line, using the protrusion electrode as a gate electrode.

2. The pixel of claim 1, wherein the first and second thin film transistors are disposed in a horizontal direction crossing the protrusion electrode.

3. The pixel of claim 1, wherein the pixel circuit further includes:
   a driving thin film transistor connected to a first node, a second node and the pixel power line, and
   a first storage capacitor between the first node and the second node.

4. The pixel of claim 3, wherein the pixel circuit includes a first circuit area and a second circuit area disposed by interposing the light emission area,
   the driving thin film transistor is disposed in the first circuit area,
   the first and second thin film transistors are disposed in the second circuit area, and
   the first storage capacitor is overlapped with the light emission area and disposed between the first circuit area and the second circuit area.

5. The pixel of claim 4, wherein the second circuit area further includes a second storage capacitor disposed between the gate electrode of the driving thin film transistor and a source electrode of any one of the first and second thin film transistors.

6. The pixel of claim 4, further comprising a reference line to which a reference voltage is applied,
wherein the first thin film transistor is connected to the gate line, the reference line and the source electrode of the driving thin film transistor which is the first node, and
the second thin film transistor is connected to the gate line, the data line and the gate electrode of the driving thin film transistor which is the second node.

7. The pixel of claim 6, wherein the first thin film transistor includes a reference line connection pattern crossing the protrusion electrode and connected to the reference line, and
the second thin film transistor includes a data line connection pattern extended in parallel with the reference line connection pattern and connected to the data line.

8. The pixel of claim 7, wherein the reference line connection pattern and the data line connection pattern are formed as a part of an active layer.

9. The pixel of claim 7, wherein the reference line connection pattern and the data line connection pattern are formed of an active multi-layered structure in which an active layer and at least one metal material layer are deposited.

10. The pixel of claim 7, wherein the reference line connection pattern and the data line connection pattern are cut by being simultaneously subjected to repair cutting in a length direction of the protrusion electrode when a dark defect occurs.

11. A display device comprising:
a plurality of subpixels each disposed in a pixel area defined by a gate line, a data line and a pixel power line, and having a light emission area and a pixel circuit,
wherein the pixel circuit includes:
a driving thin film transistor connected to a first node, a second node and the pixel power line;
a first switching thin film transistor connected to the gate line, the data line and the first node disposed parallel to the gate line;
a second switching thin film transistor disposed parallel to the first switching thin film transistor and connected to the gate line, a reference line and the second node;
a capacitor between the first node and the second node; and
a protrusion electrode protruded from the gate line to overlap each of the first and second switching thin film transistors,
wherein the protrusion electrode is a gate electrode of each of the first and second switching thin film transistors.

12. The display device of claim 11, wherein the protrusion electrode is protruded from the gate line along a length direction of the data line, and
the first and second switching thin film transistors are disposed in parallel in a horizontal direction crossing the protrusion electrode.

13. The display device of claim 12, wherein the pixel circuit includes a first circuit area and a second circuit area disposed by interposing the light emission area,
the driving thin film transistor is disposed in the first circuit area,
the first and second switching thin film transistors are disposed in the second circuit area, and
the capacitor is overlapped with the light emission area and disposed between the first circuit area and the second circuit area.

14. The display device of claim 13, wherein the second circuit area further includes an auxiliary capacitor disposed between a gate electrode of the driving thin film transistor and a source electrode of any one of the first and second switching thin film transistors.

15. The display device of claim 13, wherein the second switching thin film transistor is connected to the gate line, the reference line, and a source electrode of the driving thin film transistor, and
the first switching thin film transistor is connected to the gate line, the data line and the gate electrode of the driving thin film transistor.

16. The display device of claim 15, wherein the second switching thin film transistor includes a reference line connection pattern extended in a horizontal direction crossing the protrusion electrode and connected to the reference line, and
the first switching thin film transistor includes a data line connection pattern extended in parallel with the reference line connection pattern and connected to the data line.

17. The display device of claim 16, wherein the reference line connection pattern and the data line connection pattern are formed as a part of an active layer.

18. The display device of claim 16, wherein the reference line connection pattern and the data line connection pattern are formed of an active multi-layered structure in which an active layer and at least one metal material layer are deposited.

19. The display device of claim 16, wherein the reference line connection pattern and the data line connection pattern are cut by being simultaneously subjected to repair cutting in a length direction of the protrusion electrode when a dark defect occurs.

* * * * *